United States Patent [19]
Kuo

[11] Patent Number: 6,083,847
[45] Date of Patent: Jul. 4, 2000

[54] METHOD FOR MANUFACTURING LOCAL INTERCONNECT

[75] Inventor: Chien-Li Kuo, Hsinchu Hsien, Taiwan

[73] Assignee: United Microelectronics Corp., Taiwan

[21] Appl. No.: 08/998,771

[22] Filed: Dec. 29, 1997

[30] Foreign Application Priority Data

Oct. 4, 1997 [TW] Taiwan ................................. 86114501

[51] Int. Cl.$^7$ ................................................. H01L 21/28
[52] U.S. Cl. ........................ 438/745; 438/753; 438/754; 438/755
[58] Field of Search .................... 438/745, 751, 438/755, 754, 756, 649, 769

[56] References Cited

U.S. PATENT DOCUMENTS

| | | | |
|---|---|---|---|
| 5,086,017 | 2/1992 | Lu ............................................ | 437/200 |
| 5,229,307 | 7/1993 | Vora et al. ................................. | 437/31 |
| 5,312,781 | 5/1994 | Gregor et al. ............................ | 437/235 |
| 5,856,226 | 1/1999 | Wu .......................................... | 438/291 |

*Primary Examiner*—Benjamin L. Utech
*Assistant Examiner*—Lan Vinh
*Attorney, Agent, or Firm*—Rabin & Champagne, P.C.

[57] ABSTRACT

A method for manufacturing local interconnects includes providing a substrate with a gate oxide layer thereover, a first gate electrode and a second gate electrode above the gate oxide layer, spacers on the sidewalls of the gate electrodes, including a first spacer on one sidewall of the first gate electrode and a second spacer on the other sidewall of the first gate electrode. Then, a photoresist layer is applied while keeping the first spacer exposed. Subsequently, the first spacer is removed to expose the sidewall of the first gate electrode. Then, a metal silicide layer is formed over the first gate electrode, the second gate electrode, the one sidewall of the first gate electrode and the substrate. Wet etching is used to remove the first spacer so that local interconnects are automatically formed after the self-aligned silicide processing operation.

13 Claims, 3 Drawing Sheets

METHOD FOR MANUFACTURING LOCAL INTERCONNECT

BACKGROUND OF THE INVENTION

1. Field of Invention

The present invention relates to a method for manufacturing semiconductor devices. More particularly, the present invention relates to a method for manufacturing local interconnects.

2. Description of Related Art

When the level of integration for integrated circuits is increased to such an extent that there is insufficient surface area on the wafer surface for laying the necessary interconnects, a design having two or more metallic layers is becoming common. This is especially true for rather sophisticated devices such as microprocessors. Sometimes four or Five metallic layers are required to finish the interconnection of devices in a microprocessor.

FIGS. 1A through 1D are cross-sectional views showing the progression of manufacturing steps in the production of local interconnect according to a conventional method. First, in FIG. 1A, a substrate 10 that has shallow trench isolation (STI) already formed in the substrate for defining a device region is provided. Furthermore, a gate oxide layer 12 has already been formed over the substrate 10, a first gate electrode 13 and a second gate electrode 14 has already been formed in the device region above the gate oxide layer 12, and spacers 15 has already formed on the sidewalls of the first and the second gate electrodes 13 and 14, respectively. The first gate electrode 13 and the second gate electrode 14 are composed of doped polysilicon, and the spacers are composed of silicon dioxide.

Next, as shown in FIG. 1B, a self-aligned silicide processing operation is performed. For example, a magnetron DC sputtering method is used to deposit a layer of metal such as titanium (Ti) over the first gate electrode 13, the second gate electrode 14 and the gate oxide layer 12. The deposited titanium layer preferably has a thickness of between 200 Å to 1000 Å. In the subsequent step, heating to a high temperature, the titanium layer is made to react with the first gate electrode 13, the second gate electrode 14 and the gate oxide layer 12 to form metal suicide layers 16. This metal silicide layers 16 are titanium suicide layers, for example. After that, unreacted and residual metallic material is removed.

Next, as shown in FIG. 1C, a reactive sputtering method is used to deposit a titanium nitride (TiN) layer 17a over the first gate electrode 13, the second gate electrode 14, the spacers 15 and the gate oxide layer 12. The titanium nitride layer 17a is formed by bombarding a titanium target with ions using a reactive gas mixture of argon and nitrogen The titanium sputtered out from the target due to ion bombardment reacts with the nitrogen atoms in the plasma to form the titanium nitride layer 17a. Thereafter, a layer of photoresist 18 is formed over the second gate electrode 14 and covers half of the surface between the first gate electrode 13 and the second gate electrode 14 above the gate oxide layer 12.

Next, as shown in FIG. 1D, the titanium nitride layer 17a not covered by a photoresist layer 18 is etched away to form a titanium nitride layer 17b.

Finally, subsequent processes, such as the removal of the photoresist layer 18, are performed to complete the fabrication of local interconnect. These subsequent processes are familiar to those skill in the art, and their detailed description is therefore omitted.

In the above conventional method of fabricating local interconnects, a rather complicated processing sequence is followed. The processing steps include titanium nitride deposition, patterning and etching. Hence, great differences in height levels can be produced on the wafer surface, which may adversely affect subsequent processing operations.

In light of the foregoing, there is a need in the art to provide a better method for manufacturing local interconnects.

SUMMARY OF THE INVENTION

Accordingly, the present invention is directed to a method for manufacturing local interconnects such that local interconnects are automatically formed along with the self-aligned silicide processing operation. Thus, titanium nitride deposition, patterning and etching steps are saved, and height differences on the wafer surface are greatly reduced, thereby simplifying subsequent processing operations.

To achieve these and other advantages and in accordance with the purpose of the invention, as embodied and broadly described herein, the invention provides a method for manufacturing local interconnects. The method comprises the steps of providing a substrate that has shallow trench isolation already formed in the substrate for defining a device region, and a gate oxide layer already formed over the substrate. Furthermore, a first gate electrode and a second gate electrode have already been above the gate oxide layer, third spacers have been formed on the sidewalls of the second gate electrode, a first spacer has been formed on one sidewall of the first gate electrode and a second spacer has been formed on the other sidewall of the first gate electrode.

Then, a photoresist layer is formed over the second gate electrode, the third spacers of the second gate electrode, the first gate electrode and the second spacer of the first gate electrode, exposing the first spacer of the first gate electrode.

Subsequently, the first spacer is removed to expose the sidewall of the first gate electrode, and then the photoresist layer is removed. Finally, a metal silicide is formed over the first gate electrode, the second gate electrode, one of the sidewalls of the first gate electrode and the substrate.

The first characteristic of this invention is the removal of first spacer to expose the sidewall of the first gate electrode using a wet etching method. Therefore, local interconnects are automatically formed when the subsequent self-aligned metal silicide processing step is carried out.

The second characteristic of this invention is the elimination of processing steps including titanium nitride deposition, patterning and etching. Hence, there will be less height differences on the wafer surface, which will facilitate subsequent manufacturing processes.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve, to explain the principles of the invention. In the drawings.

DESCRIPTION OF THE PREFERRED EMBODIMENTS

Figure 1A:
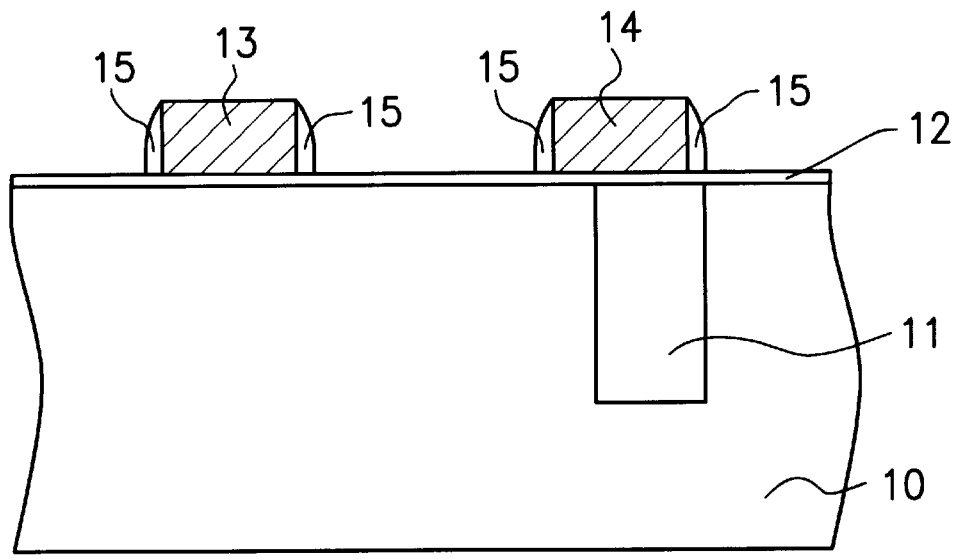
FIGS. 1A through 1D are cross-sectional views showing the progression of manufacturing steps in the production of local interconnects according to a conventional method.
Figure 1B:
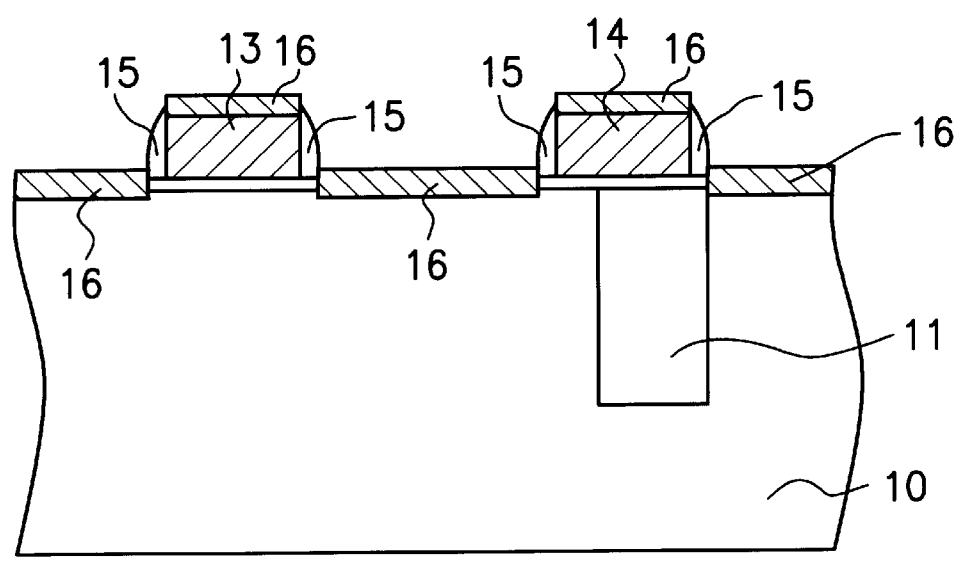
Figure 1C:
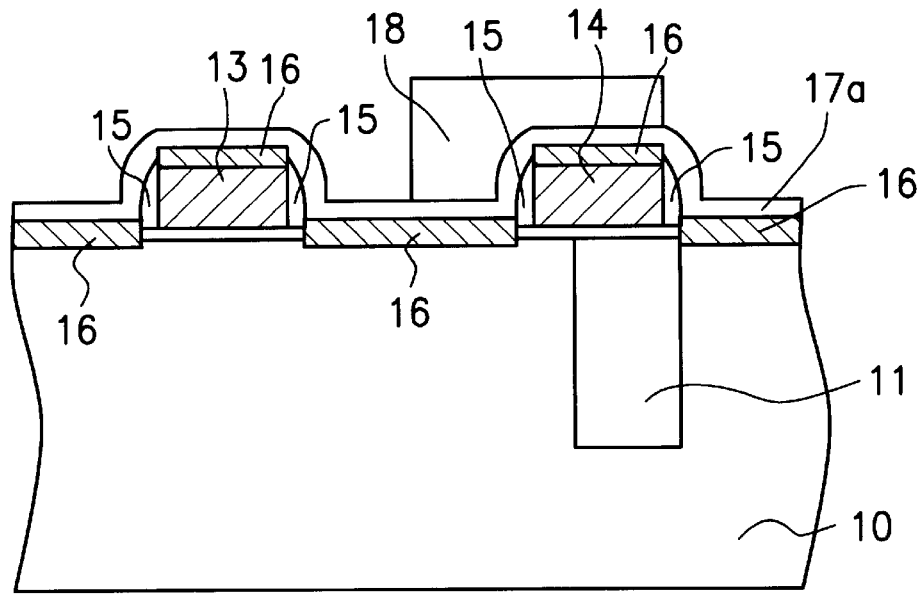
Figure 1D:
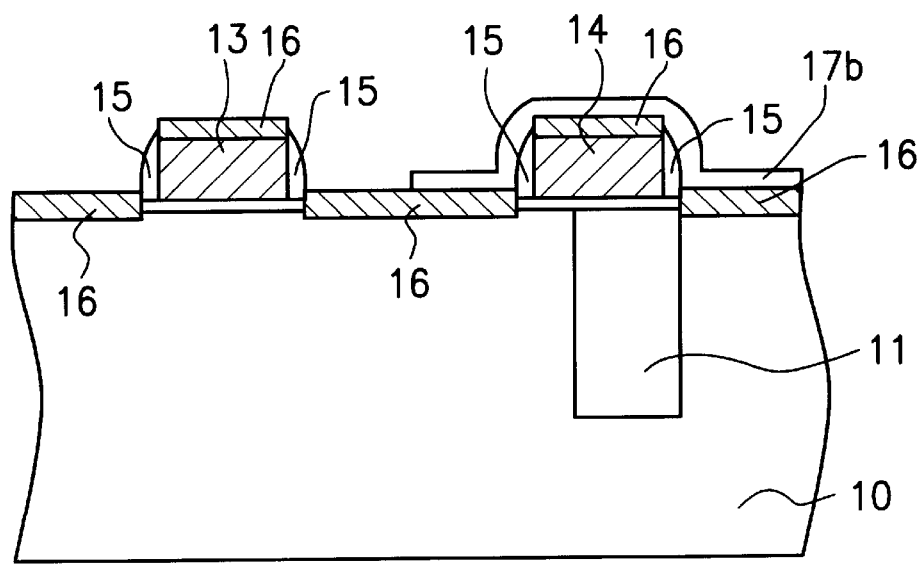

Reference will now be made in detail to the present preferred embodiments of the invention, examples of which are illustrated in the accompanying drawings. Wherever possible, the same reference numbers are used in the drawings and the description to refer to the same or like parts.

Figure 2A:
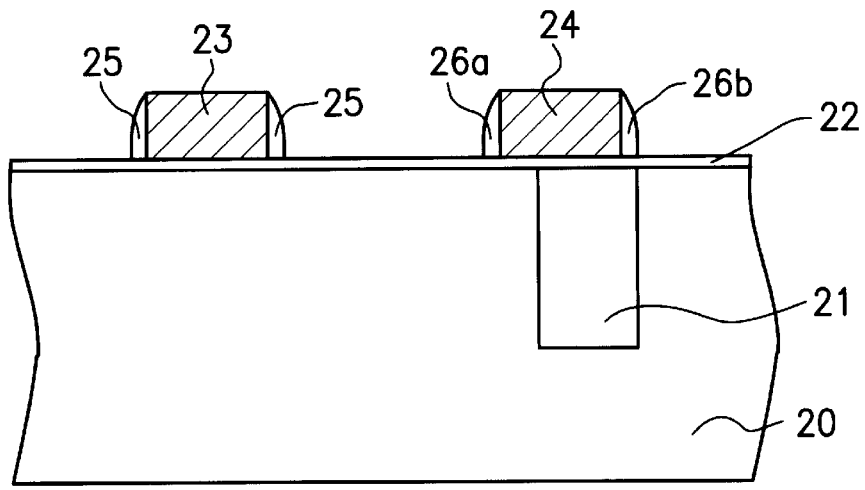
FIGS. 2A through 2C are cross-sectional views showing the progression of manufacturing steps in the production of local interconnects according to one preferred embodiment of this invention.
Figure 2B:
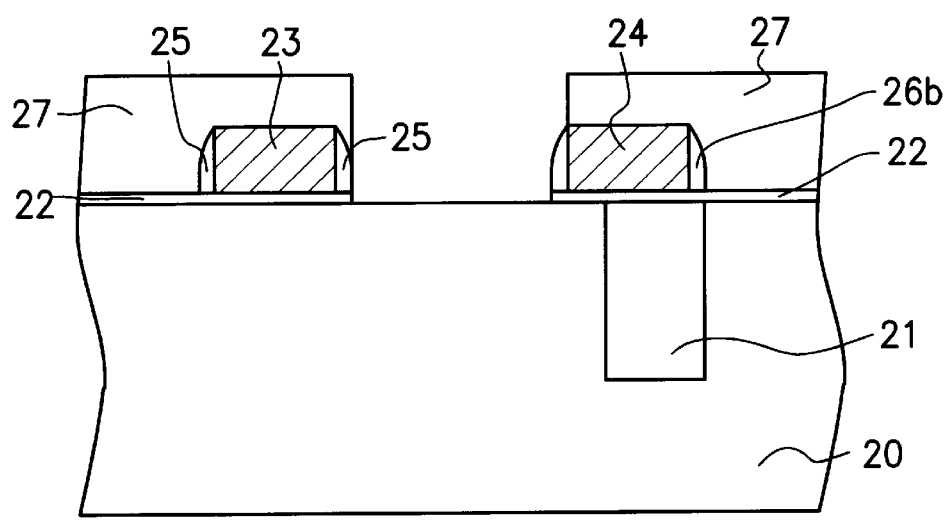
Figure 2C:
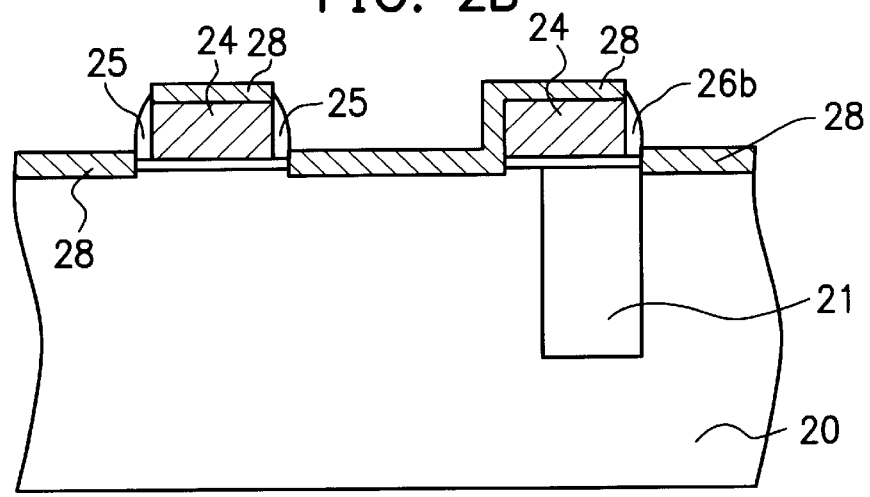

FIGS. 2A through 2C are cross-sectional views showing the progression of manufacturing steps in the production of local interconnects according to one preferred embodiment of this invention. First, as shown in FIG. 2A, a substrate 20 that has shallow trench isolation for defining a device region is provided. Furthermore, a gate oxide layer 22 has already been formed over the substrate 20, a first gate electrode 24 and a second gate electrode 23 has been formed in the device region above the gate oxide layer 22, third spacers 25 has been formed on the sidewalls of the second gate electrodes 23, and a second spacer 26b and a first spacer 26a has been formed on each side sidewall of the first gate electrode 24, respectively. The second gate electrode 23 and the first gate electrode 24 are composed of doped polysilicon, and the third spacers 25, the second spacer 26b and the first spacer 26a are composed of silicon dioxide.

Next, as shown in FIG. 2B, a photoresist layer 27 is formed over the second gate electrode 23, the third spacers 25, the first gate electrode 24, the second spacer 26b of the first gate electrode 24 and portions of the gate oxide layer 22. The first spacer 26a on the sidewall of the first gate electrode 24 and the gate oxide layer 22 between the second gate electrode 23 and the first gate electrode 24, are exposed. In the subsequent step, using an isotropic wet etching method, the first spacer 26a is removed to expose the sidewall of the first gate electrode 24. The gate oxide layer 22 between the second gate electrode 23 and the first gate electrode 24 is removed to expose the substrate layer 20.

Next, as shown in FIG. 2C, the photoresist layer 27 is removed. Thereafter, a self-aligned silicide processing operation is performed. For example, a magnetron DC sputtering method is used to deposit a layer of metal such as titanium (Ti) over the second gate electrode 23, the first gate electrode 24, the gate oxide layer 22 and the exposed substrate 20. The deposited titanium layer preferably has a thickness of between 200 Å and 1000 Å. In the subsequent step, heating to a high temperature, the titanium layer reacts with the second gate electrode 23, the first gate electrode 24, the gate oxide layer 22 and the substrate 20 to form metal silicide layers 28. Portions of the metal silicide layers 28 form a continuous layer which links up the first gate electrode 24, the sidewall of the first gate electrode 24 and the substrate 20. The metal silicide layers 28 can be made from titanium silicide, for example. The continuous metal silicide layer 28 acts as local interconnects that extend to regions in the substrate where contact is desired, for example, the source/drain regions. After the hot processing step, unreacted and residual metallic material is removed.

The first characteristic of this invention is the removal of first spacer 26a to expose the sidewall of the first gate electrode 24 using a wet etching method. Therefore, local interconnects are automatically formed when the subsequent self-aligned metal silicide processing step is carried out.

The second characteristic of this invention is the elimination of processing steps including titanium nitride deposition, patterning and etching. Hence, there will be less height differences on the wafer surface, which will facilitate subsequent manufacturing processes.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing local interconnects, comprising:

providing a substrate with an isolating structure formed, a gate oxide layer over the substrate, a gate electrode above the gate oxide layer wherein the gate electrode has opposite sidewalls, a first spacer on one of the gate electrode sidewalls, and a second spacer on the other of the gate electrode sidewalls;

providing a layer of photoresist over the gate electrode, the gate oxide layer and the second spacer, while leaving the first spacer exposed;

removing the first spacer to expose the one sidewall of the gate electrode while leaving the other sidewall of the gate electrode covered by the second spacer;

removing the photoresist layer; and performing a self-aligned silicide processing operation to form a continuous metal silicide layer simultaneously over the gate electrode, the one sidewall of the gate electrode and portions of the substrate leading to a local interconnect termination region, while leaving the other sidewall of the gate electrode covered by the second spacer.

2. The method of claim 1, wherein the coating the photoresist layer further includes exposing the gate oxide layer.

3. The method of claim 2, wherein the removing the first spacer further includes removing the gate oxide layer to expose the substrate.

4. The method of claim 1, wherein the removing the first spacer includes wet etching.

5. The method of claim 3, wherein the removing the gate oxide layer includes wet etching.

6. The method of claim 1, wherein the performing the self-aligned silicide processing operation includes:

forming a metallic layer over the gate electrode and the gate oxide layer; and heating the metallic layer, the gate electrode, the gate oxide layer and the substrate so that the metal reacts with the gate electrode, the gate oxide layer and the substrate to form a continuous metal silicide layer.

7. The method of claim 6, further including removing the unreacted metallic layer, after the self-aligned silicide processing operation.

8. The method of claim 6, wherein the forming the metallic layer includes depositing titanium.

9. The method of claim 1, wherein the isolating structure is a shallow trench isolation.

10. The method of claim 1, wherein the forming the metal silicide layer includes depositing titanium silicide.

11. The method of claim 1, wherein the forming the gate electrode includes depositing doped polysilicon.

12. The method of claim 1, wherein the forming the first spacer includes depositing silicon dioxide.

13. The method of claim 1, wherein the forming the second spacer includes depositing silicon dioxide.

* * * * *